(12) United States Patent
Doi et al.

(10) Patent No.: US 10,968,535 B2
(45) Date of Patent: Apr. 6, 2021

(54) SIC SINGLE CRYSTAL PRODUCTION METHOD AND PRODUCTION APPARATUS

(71) Applicant: TOYOTA JIDOSHA KABUSHIKI KAISHA, Toyota-shi, Aichi-ken (JP)

(72) Inventors: Masayoshi Doi, Nagoya (JP); Hironori Daikoku, Susono (JP); Motohisa Kado, Gotemba (JP); Tomohiro Sato, Tajimi (JP); Kazuaki Seki, Futtsu (JP); Kazuhiko Kusunoki, Nishinomiya (JP); Yutaka Kishida, Kisarazu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/946,334

(22) Filed: Apr. 5, 2018

(65) Prior Publication Data

US 2018/0312996 A1    Nov. 1, 2018

(30) Foreign Application Priority Data

Apr. 26, 2017   (JP) .............................. JP2017-087634

(51) Int. Cl.

| C30B 9/00 | (2006.01) |
|---|---|
| C30B 29/36 | (2006.01) |
| C30B 9/06 | (2006.01) |
| C30B 15/10 | (2006.01) |
| C30B 15/14 | (2006.01) |
| C30B 15/30 | (2006.01) |
| C30B 19/04 | (2006.01) |
| C30B 19/08 | (2006.01) |

(52) U.S. Cl.
CPC ................ *C30B 29/36* (2013.01); *C30B 9/06* (2013.01); *C30B 15/10* (2013.01); *C30B 15/14* (2013.01); *C30B 15/305* (2013.01); *C30B 19/04* (2013.01); *C30B 19/08* (2013.01)

(58) Field of Classification Search
CPC .............. C30B 9/04; C30B 9/00; C30B 29/36
See application file for complete search history.

(56) References Cited

U.S. PATENT DOCUMENTS

| 9,617,655 B2 * | 4/2017 | Okada ...................... C30B 29/36 |
| 2012/0132130 A1 | 5/2012 | Nomura et al. |
| 2015/0167196 A1 | 6/2015 | Kado et al. |

(Continued)

FOREIGN PATENT DOCUMENTS

| CN | 201933198 U | 8/2011 |
| CN | 106167916 A | 11/2016 |
| JP | 2012-180244 | * 9/2012 |

(Continued)

*Primary Examiner* — Robert M Kunemund
(74) *Attorney, Agent, or Firm* — Oliff PLC

(57) ABSTRACT

A method for a SiC single crystal that allow prolonged growth to be achieved are provided. A method for producing a SiC single crystal in which a seed crystal substrate held on a seed crystal holding shaft is contacted with a Si—C solution having a temperature gradient such that a temperature of the Si—C solution decreases from an interior of the Si—C solution toward a liquid level of the Si—C solution, in a graphite crucible, to grow a SiC single crystal, wherein the method comprises the steps of: electromagnetic stirring of the Si—C solution with an induction coil to produce a flow, and heating of a lower part of the graphite crucible with a resistance heater.

8 Claims, 13 Drawing Sheets

(56) References Cited

U.S. PATENT DOCUMENTS

2016/0340794 A1* 11/2016 Daikoku .................. C30B 29/36
2017/0306522 A1* 10/2017 Kamei .................... C30B 29/36

FOREIGN PATENT DOCUMENTS

| JP | 2013-173645 A | 9/2013 |
|---|---|---|
| KR | 10-2012-0057536 A | 6/2012 |
| KR | 10-2015-0023031 A | 3/2015 |

* cited by examiner

DISSOLVED CRUCIBLE SECTION

SHAPE OF CRUCIBLE BEFORE CRYSTAL GROWTH $\Delta Td$

SIC SINGLE CRYSTAL PRODUCTION METHOD AND PRODUCTION APPARATUS

TECHNICAL FIELD

The present disclosure relates to a SiC single crystal production method and production apparatus.

BACKGROUND ART

SiC single crystals are thermally and chemically very stable, superior in mechanical strength, and resistant to radiation, and also have superior physical properties, such as high breakdown voltage and high thermal conductivity compared to Si single crystals. They are therefore able to exhibit high output, high frequency, voltage resistance, and environmental resistance that cannot be realized with existing semiconductor materials, such as Si single crystals and GaAs single crystals. For this reason they are being considered ever more promising as next-generation semiconductor materials for a wide range of applications including power device materials that allow high power control and energy saving to be achieved, device materials for high-speed large volume information communication, high-temperature device materials for vehicles, radiation-resistant device materials, and the like.

Typical growth processes for growing SiC single crystals that are known in the prior art include gas phase processes, the Acheson process and solution processes. Gas phase processes, such as sublimation processes, have a drawback in that grown single crystals have been prone to hollow penetrating defects known as micropipe defects, lattice defects, such as stacking faults, and generation of polymorphic crystals. However, in the prior art, most SiC bulk single crystals are produced by sublimation processes, with attempts being made to reduce the defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or molten Si in which a metal other than Si has been melted is formed in a graphite crucible, and carbon is dissolved into the molten liquid, and a SiC crystal layer is deposited and grown on a seed crystal substrate set in the low temperature section. Solution processes can be expected to reduce defects because crystal growth is carried out in a state of near thermal equilibrium, compared to gas phase processes. Therefore, methods for producing SiC single crystals by solution processes have been proposed in recent years (PTL 1).

CITATION LIST

Patent Literature

[PTL 1] Japanese Unexamined Patent Publication No. 2013-173645

SUMMARY OF THE INVENTION

Problems to be Solved by the Invention

PTL 1 discloses a method for producing a SiC single crystal by a solution process using a resistance heating system heater or an induction heating system heater. With the prior art of PTL 1, however, it is difficult to reduce variation in the temperature distribution of a Si—C solution when it is placed in contact with the inner wall of a graphite crucible, and as a result carbon elutes from the graphite crucible in a non-uniform manner, creating holes in the crucible where local dissolution of the crucible takes place and making it difficult to achieve prolonged growth.

A need therefore exists for a method and production apparatus for a SiC single crystal that allow prolonged growth to be achieved.

Means for Solving the Problems

The gist of the present invention is as follows.

(1) A method for producing a SiC single crystal in which a seed crystal substrate held on a seed crystal holding shaft is contacted with a Si—C solution having a temperature gradient such that a temperature of the Si—C solution decreases from an interior of the Si—C solution toward a liquid level of the Si—C solution, in a graphite crucible, to grow a SiC single crystal, wherein the method comprises the steps of:

electromagnetic stirring of the Si—C solution with an induction coil to produce a flow, and heating of a lower part of the graphite crucible with a resistance heater.

(2) The method for producing a SiC single crystal according to (1) above, wherein the heating of the lower part of the graphite crucible comprises at least one of heating of a bottom section of the graphite crucible and heating of a crucible-holding shaft that holds the bottom section of the graphite crucible.

(3) The method for producing a SiC single crystal according to (1) or (2) above, wherein the method further comprises heating of side sections of the graphite crucible with the resistance heater.

(4) An apparatus for production of a SiC single crystal comprising:

a graphite crucible that houses a Si—C solution,
an induction coil,
a resistance heater, and
a seed crystal holding shaft disposed in a movable manner in the vertical direction, the apparatus being employed in a solution process in which a seed crystal substrate held on the seed crystal holding shaft is contacted with the Si—C solution that has been heated so as to have a temperature gradient in which a temperature of the Si—C solution decreases from an interior of the Si—C solution toward a liquid level of the Si—C solution, to grow a SiC single crystal from the seed crystal substrate, wherein the graphite crucible is held on the crucible-holding shaft by a bottom section of the graphite crucible, the induction coil is situated surrounding side sections of the graphite crucible, and the resistance heater is disposed at a location such that the resistance heater heats a lower part of the graphite crucible.

(5) The apparatus for production of a SiC single crystal according to (4) above, wherein the resistance heater is disposed in at least one of a location facing a lower face of the bottom section of the graphite crucible and a location surrounding the crucible-holding shaft.

(6) The apparatus for production of a SiC single crystal according to (4) or (5) above, wherein the resistance heater is further disposed surrounding the side sections of the graphite crucible and inside the induction coil.

Effect of the Invention

The method and apparatus of the invention allow prolonged growth of a SiC single crystal to be achieved.

DESCRIPTION OF EMBODIMENTS

Throughout the present specification, the indication "-1" in an expression, such as "(000-1) face", is used where normally a transverse line is placed over the numeral.

For growth of a SiC single crystal by a conventional solution process, usually a graphite crucible and starting material are heated to melt the starting material while causing carbon to dissolve from the graphite crucible into the molten starting material, thus forming a Si—C solution which is caused to flow with an induction coil in order to supply solute to the growth interface for crystal growth. Dissolving the graphite crucible in this way allows the necessary amount of carbon to be provided for growth of a SiC single crystal. However, since dissolution of the crucible is gradually increased in localized regions so that holes are formed in the crucible, it has been difficult to conduct prolonged crystal growth.

The present inventors have obtained the following new knowledge as a result of the research aimed at achieving prolonged growth of SiC single crystals.

When the heating method used is high-frequency induction heating with an induction coil (also referred to as a "high-frequency coil") in a conventional SiC single crystal production apparatus, the temperature of the Si—C solution at regions in contact with the inner wall of the graphite crucible exhibit a certain distribution inside the crucible. This temperature distribution is generally such that the liquid level region of the Si—C solution in contact with the inner side wall of the graphite crucible is at relatively high temperature, while the region of the Si—C solution in contact with the bottom inner wall of the graphite crucible is at relatively low temperature.

Since most graphite crucibles tend to consist of homogeneous materials with essentially constant density, the tendency of the graphite crucible to dissolve depends on the temperature distribution of the Si—C solution that contacts with the inner wall of the graphite crucible. Thus, dissolution of the graphite crucible occurs preferentially from the regions where the Si—C solution in contact with the inner wall of the graphite crucible is at the highest temperature.

Figure 1:
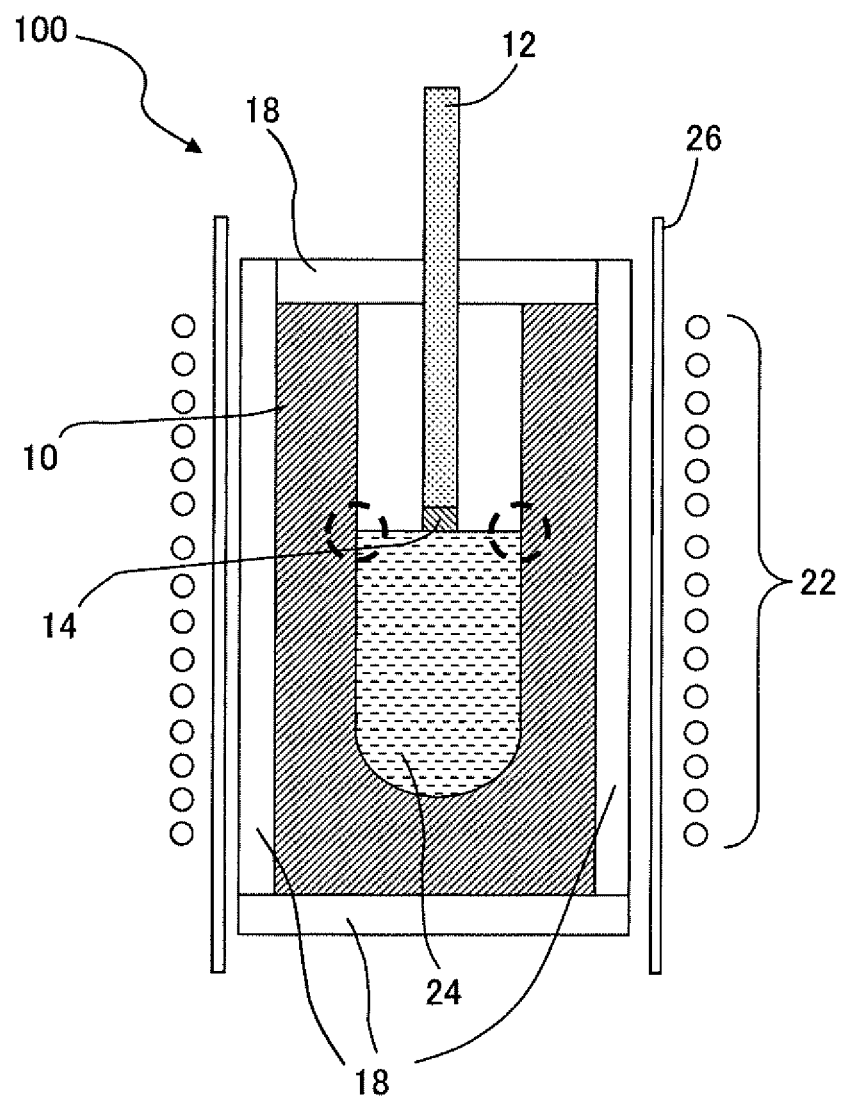
FIG. 1 is a cross-sectional schematic drawing of a SiC single crystal production apparatus of the type used in the prior art.

FIG. 1 shows a cross-sectional schematic view of a SiC single crystal production apparatus of the type used in the prior art. The SiC single crystal production apparatus 100 shown in FIG. 1 comprises an induction coil 22 surrounding the side section of the graphite crucible 10, so that flowing and heating of the Si—C solution 24 is caused by electromagnetic stirring, which can be induced by the induction coil 22. Carbon dissolves into the Si-containing molten liquid from the graphite crucible 10, forming a Si—C solution 24.

Since heating to the highest temperature takes place at the boundary between the liquid level of the Si—C solution 24 and the inner wall of the side sections of the graphite crucible 10, indicated by dashed circles in FIG. 1, and the Si—C solution 24 flows inside the crucible by electromagnetic stirring with the induction coil 22, the amount of carbon dissolving from the graphite crucible 10 (dissolution from the crucible) is maximal near the boundary. Local dissolution (hereunder also referred to as "melting loss") of the crucible near the boundary imposes a restriction on the length of the crystal growth time, making it difficult to obtain a long grown crystal.

Figure 2:
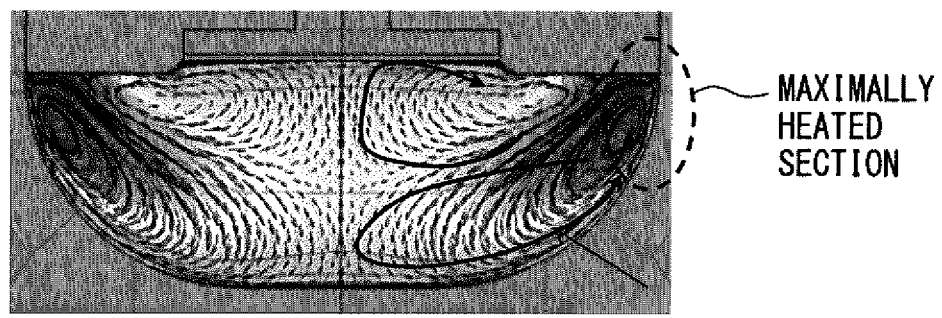
FIG. 2 shows an example of the flow and temperature distribution of a Si—C solution, during flowing and heating of the Si—C solution with an induction coil alone.

FIG. 2 shows an example of flow and temperature distribution of a Si—C solution when using the SiC single crystal production apparatus shown in FIG. 1, where an induction coil is situated surrounding the side sections of the graphite crucible and flowing and heating of the Si—C solution are carried out with the induction coil alone. The flow and the temperature distribution of the Si—C solution in FIG. 2 were calculated using CGSim (Simulation software for bulk crystal growth from solution, by STR Japan, Ver. 14.1). The maximally heated section is that indicated by the dashed ellipse, i.e. the section near the boundary between the Si—C solution liquid level and the inner wall at the side sections of the graphite crucible. The Si—C solution flows in the direction shown by the arrow.

Figure 3:
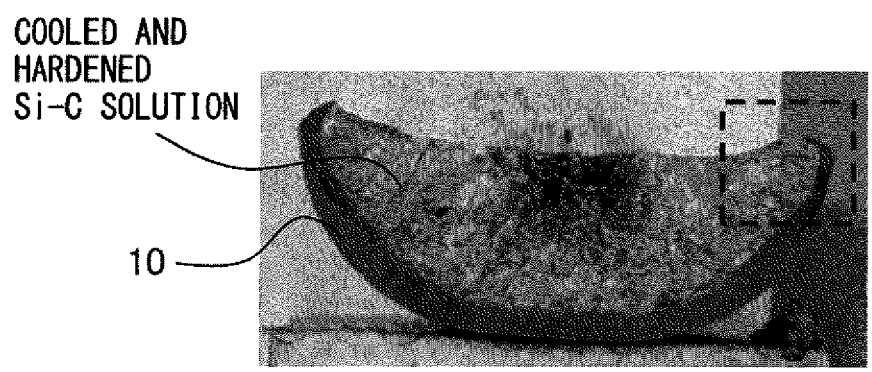
FIG. 3 is a cross-sectional photograph of a graphite crucible after flowing and heating of a Si—C solution with an induction coil alone for actual growth of a SiC single crystal.
Figure 4:
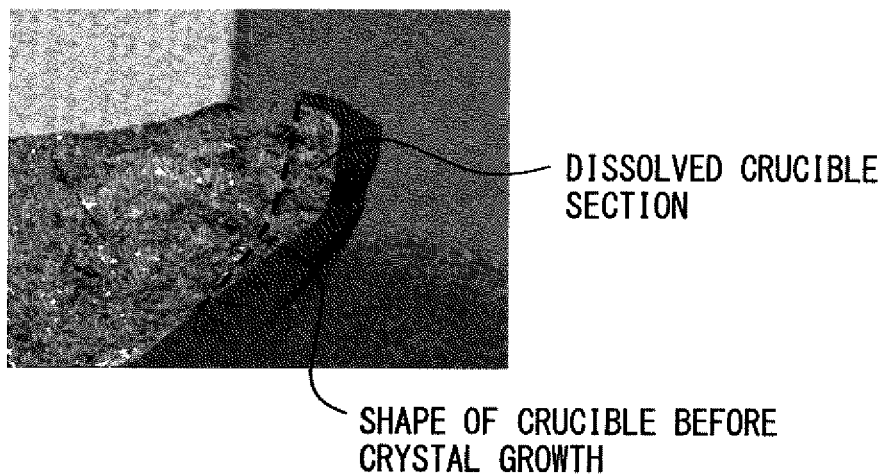
FIG. 4 is a magnified photograph showing the dashed-line region of FIG. 3.

FIG. 3 is a cross-sectional photograph of a graphite crucible taken after a SiC single crystal production apparatus, such as the one shown in FIG. 1, was used and flow and heating of a Si—C solution were carried out with an induction coil alone to actually grow a SiC single crystal. A cooled and hardened Si—C solution is produced inside the graphite crucible 10. FIG. 4 shows a magnified view of the dashed-line region of FIG. 3. The portion indicated by a dashed line in FIG. 4 is the outline of the original shape of the graphite crucible before it was used for crystal growth. It can be seen that the thickness of the crucible has decreased near the boundary between the liquid level of the Si—C solution and the graphite crucible.

Figure 5:
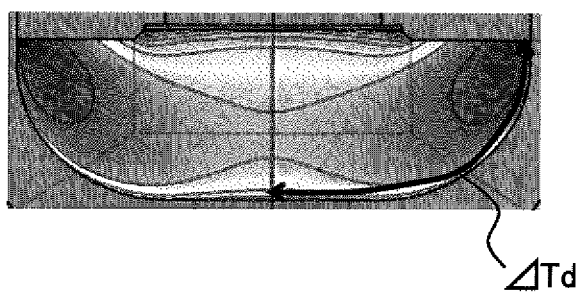
FIG. 5 shows an example of the temperature distribution of a Si—C solution in a graphite crucible, during flowing and heating of the Si—C solution with an induction coil alone.

FIG. 5 shows an example of the temperature distribution of a Si—C solution in a graphite crucible, when flow and heating of a Si—C solution are carried out with only a conventional induction coil. The Si—C solution flow and temperature distribution in FIG. 5 were calculated using CGSim. In order to lengthen the growable time period it is desirable to lower the temperature distribution $\Delta Td$ of the Si—C solution in the region indicated by the arrow. The value of $\Delta Td$ is calculated as the difference between the maximum and minimum temperatures in the regions of the Si—C solution that are in contact with the inner wall of the graphite crucible shown in FIG. 5. The region indicated by the arrow is the right half of the boundary between the inner wall of the graphite crucible and the Si—C solution. Since a graphite crucible generally has a symmetrical shape, the $\Delta Td$ value of either the right half or the left half may be used. When the graphite crucible has an asymmetrical form, $\Delta Td$ is the value for the entire Si—C solution in the region in contact with the inner wall of the graphite crucible.

Figure 6:
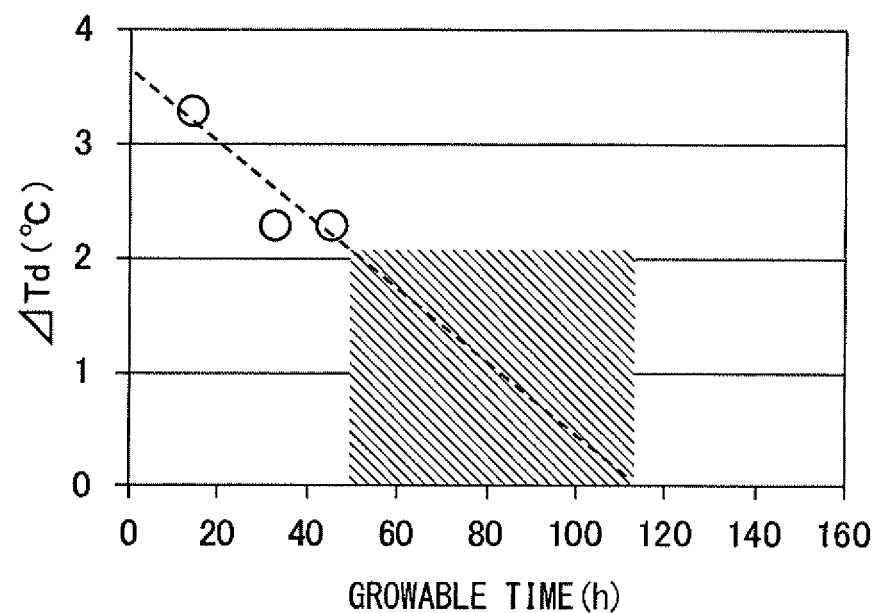
FIG. 6 is a graph showing the relationship between ΔTd and growable time period, for actual growth of a SiC single crystal using only an induction coil as the heating device.

FIG. 6 is a graph showing the relationship between $\Delta Td$ and growable time period, when actual growth of a SiC single crystal is conducted using a SiC single crystal production apparatus of the type shown in FIG. 1. The growable time period is the time from initial crystal growth until a hole forms in the graphite crucible. When flow and heating of a Si—C solution have been carried out with an induction coil alone in the prior art, it has not been possible to lower the $\Delta Td$ to below 2.3° C., and as a result the graphite crucible dissolves in a non-uniform manner during SiC single crystal growth, so that the maximum growable time period is about 45 hours, although times of longer than 50 hours are desired.

Figure 7:
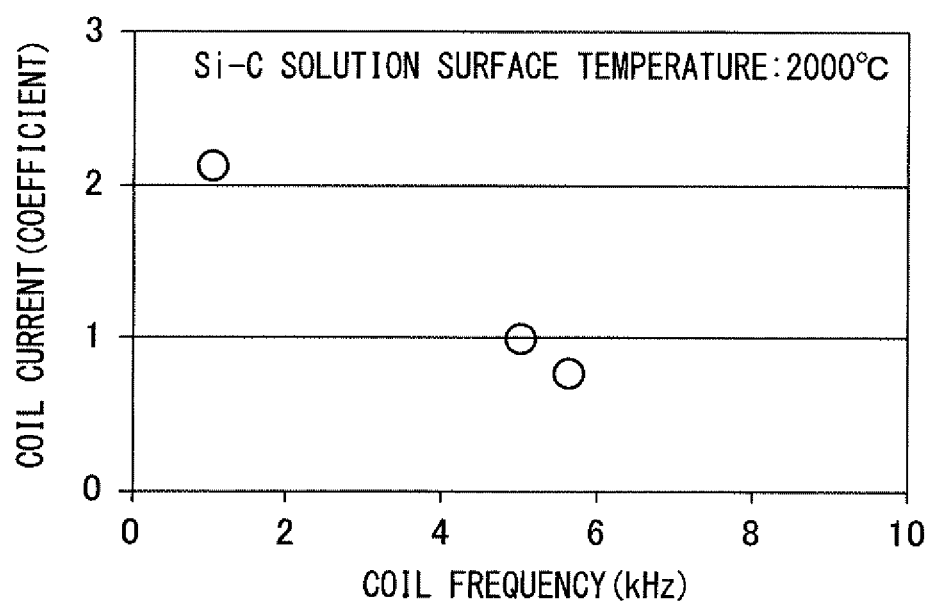
FIG. 7 is a graph showing the relationship between coil frequency and coil current (coefficient) to obtain a target temperature for a Si—C solution using an induction coil.
Figure 8:
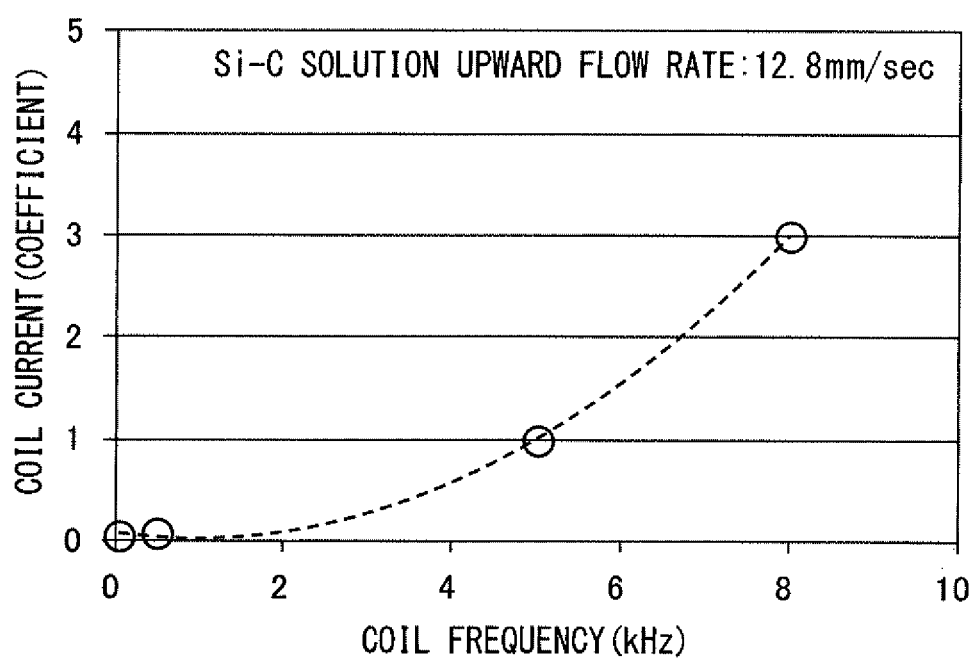
FIG. 8 is a graph showing the relationship between coil frequency and coil current (coefficient) to obtain a target flow rate for a Si—C solution using an induction coil.

FIG. 7 shows the relationship between coil frequency and coil current (coefficient), for obtaining the target temperature for a Si—C solution using an induction coil. FIG. 8 shows the relationship between coil frequency and coil current (coefficient), for obtaining the target flow rate for a Si—C solution using an induction coil. The coil current (coefficient) (hereunder referred to simply as "coil current") is a value expressed respect to 1 as the coil current in a combination of coil current and coil frequency (5000 Hz) that allows the conventional targets to be obtained for a Si—C solution, namely a temperature of 2000° C. and an upward flow rate of 12.8 mm/sec, when flow and heating of the Si—C solution are conducted with only a conventional induction coil. The graphs in FIGS. 7 and 8 were calculated using CGSim.

As shown in FIG. 7, it is necessary to either raise the coil frequency and decrease the coil current, or to lower the coil frequency and increase the coil current, in order to obtain a temperature of 2000° C. at the liquid level of the Si—C solution.

On the other hand, FIG. 8 shows that it is necessary to either lower the coil frequency and also reduce the coil current, or to raise the coil frequency and also increase the coil current, in order to obtain the desired upward flow rate of 12.8 mm/sec for a Si—C solution. The upward flow rate of the Si—C solution is the flow rate in the upward vertical direction of the Si—C solution at a location 10 mm below the bottom face (the growth surface) of the seed crystal substrate in the vertical direction.

It will be understood from FIGS. 7 and 8 that when the coil frequency and the coil current are both increased in order to obtain an upward flow of 12.8 mm/sec for a Si—C solution, the Si—C solution becomes overheated, and when the coil frequency and coil current are both reduced for the same purpose, the Si—C solution lacks sufficient heat. In other words, with a coil frequency of 5000 Hz and a coil current of 1, it is possible to set the upward flow rate of the Si—C solution to 12.8 mm/sec and the liquid level temperature to 2000° C., but it is not possible to obtain a liquid level temperature other than 2000° C. while maintaining an upward flow rate of 12.8 mm/sec, and likewise it is not possible to obtain an upward flow rate other than 12.8 mm/sec while maintaining a liquid level temperature of 2000° C.

Therefore, the conditions for the coil frequency and coil current for obtaining the desired flow rate and temperature for a Si—C solution are limited to an extremely narrow range, and hence the temperature distribution for the Si—C solution as a whole is fixed.

Thus, in a heated system with only a conventional induction coil, it is not possible to control the temperature distribution of a Si—C solution while ensuring that it has the desired flow, and as a result it is difficult to lower the $\Delta Td$ value, and melting loss of the graphite crucible proceeds, making it impossible to accomplish prolonged growth.

When a conventional resistance heater is used, it is likewise difficult to reduce the $\Delta Td$ value and also impossible to obtain the desired flow for the Si—C solution. Even when a conventional induction coil and resistance heater have been simply combined, it has not been possible to reduce the $\Delta Td$ value while ensuring that the Si—C solution has the desired flow.

On the basis of this new knowledge, the present inventors have discovered a method and apparatus for producing a SiC single crystal wherein, for a solution process in which desired flow and heating of the Si—C solution are required, a system is used that separates the function of electromagnetic induction to obtain a flow from the function of resistance heating to conduct heating, and have further found that by specifying the location of resistance heating it is possible to reduce the $\Delta Td$ value and conduct prolonged growth.

The method of the present disclosure is a method for producing a SiC single crystal in which a seed crystal substrate held on a seed crystal holding shaft is contacted with a Si—C solution having a temperature gradient such that a temperature of the Si—C solution decreases from an interior of the Si—C solution toward a liquid level of the Si—C solution, in a graphite crucible, to grow a SiC single crystal, wherein the method comprises the steps of: electromagnetic stirring of the Si—C solution with an induction coil to produce a flow, and heating of a lower part of the graphite crucible with a resistance heater.

The method of the present disclosure allows the desired flow of the Si—C solution to be obtained while lowering the $\Delta Td$ value, so that the graphite crucible can dissolve in a more uniform manner than in the prior art, and growth of a longer crystal can be achieved by prolonged crystal growth.

Figure 9:
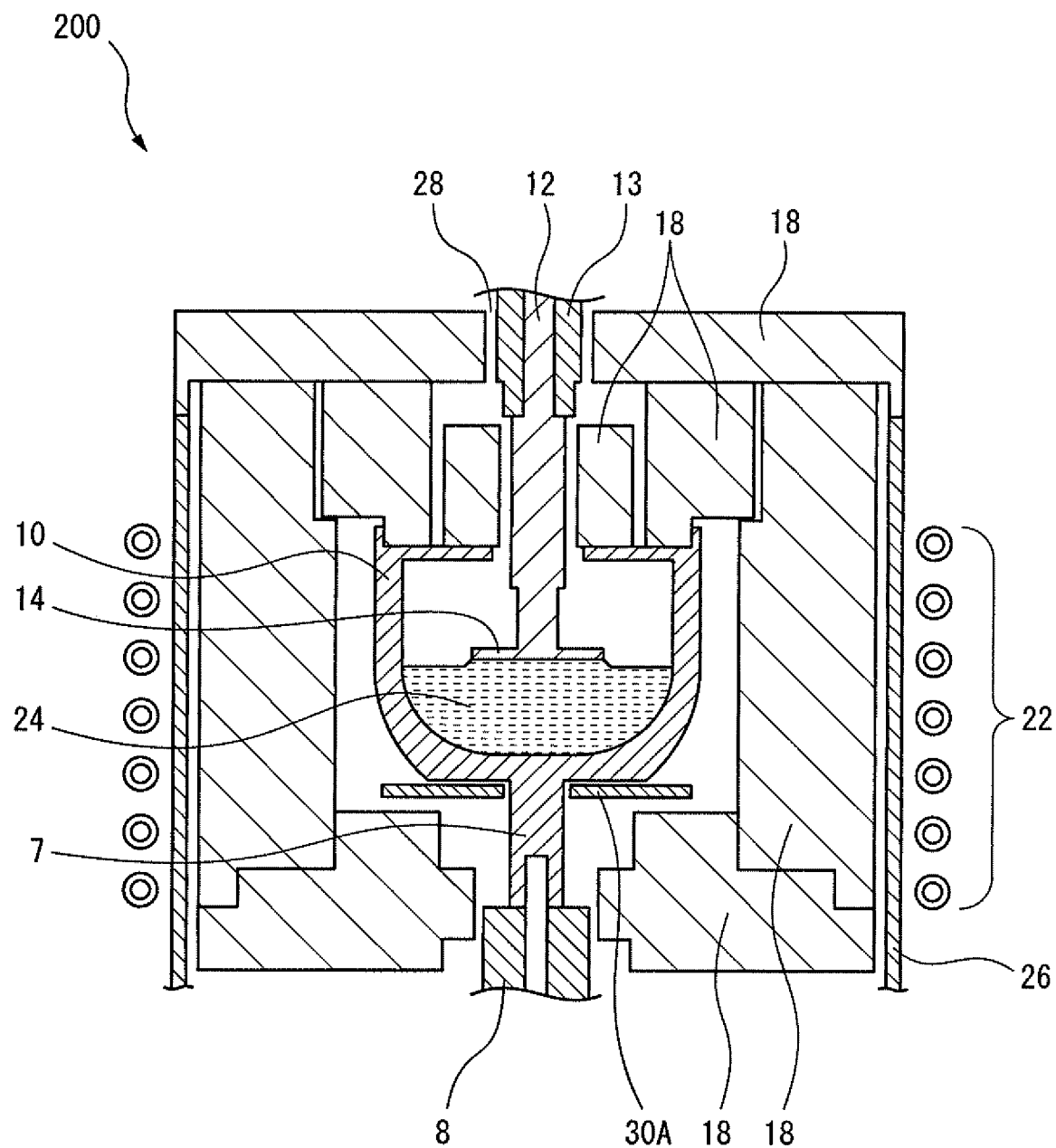
FIG. 9 is a cross-sectional schematic drawing showing a SiC single crystal production apparatus to be used in the method of the present disclosure.
Figure 10:
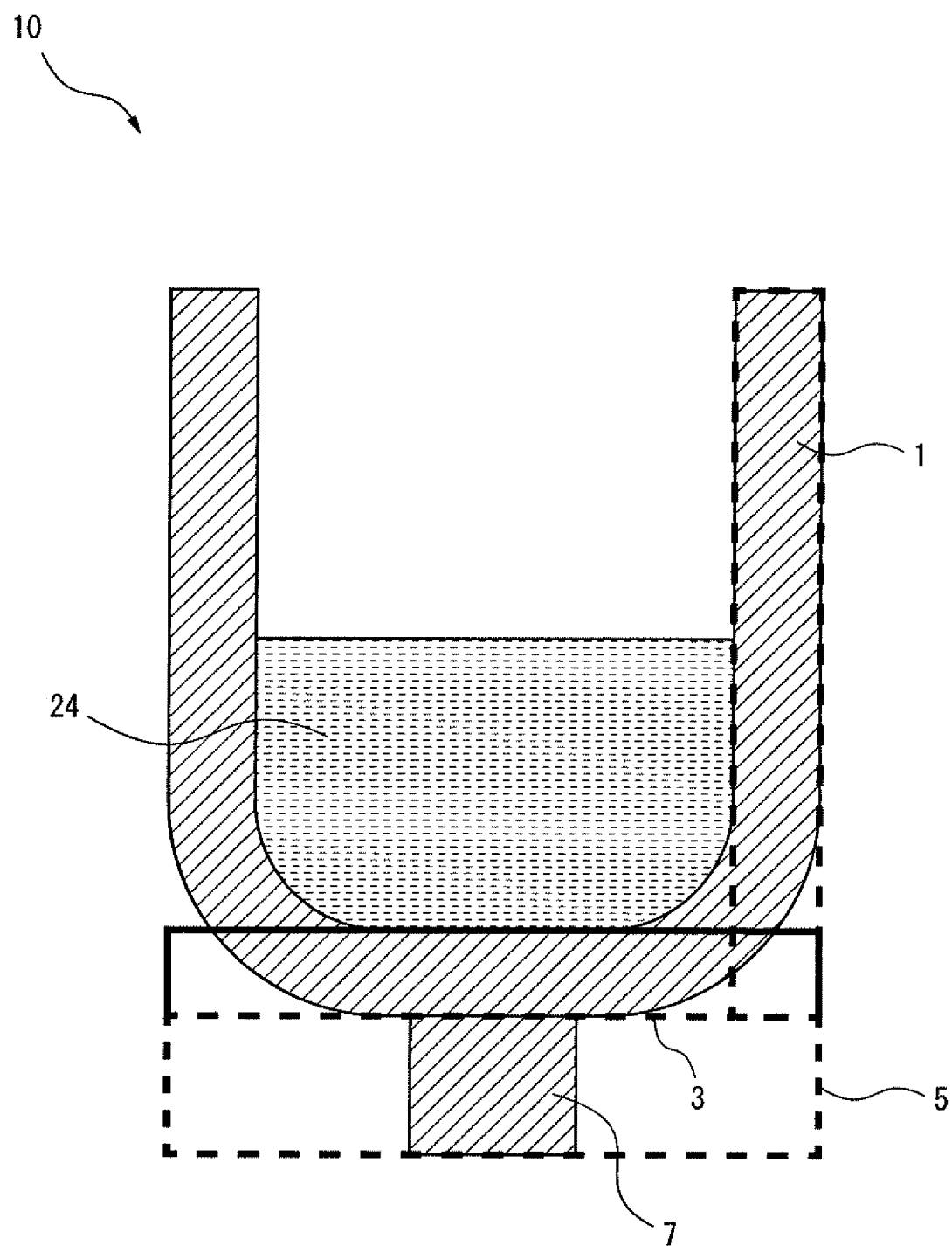
FIG. 10 is a cross-sectional schematic drawing showing an example of a graphite crucible to be used in the method of the present disclosure.

FIG. 9 shows a cross-sectional schematic drawing of an example of a SiC single crystal production apparatus that can be used in the method of the present disclosure. FIG. 10 is a cross-sectional schematic drawing showing an example of a graphite crucible to be used in the method of the present disclosure.

As shown in FIG. 10, the side section 1 of the graphite crucible 10 is the portion of the crucible in the direction of its height from its uppermost section up to its lowermost section, within the dashed-line region. The bottom section 3 of the graphite crucible 10 is the portion of the crucible in the direction of its width, within the dashed-line region. The lower part 5 of the graphite crucible is the region within the dashed line in FIG. 10, which includes the bottom section of the graphite crucible 10 and the crucible-holding shaft 7 that holds the bottom section.

The induction coil 22 electromagnetically stirs the Si—C solution 24 and causes it to flow. As shown in FIG. 9, the induction coil 22 is situated so as to surround the outer periphery at the side sections of the graphite crucible 10.

It has been found, as shown by the graph in FIG. 8, that if the frequency of the induction coil is lowered to a level of below 100 Hz which is lower than the conventional level, when attempting to obtain a desired Si—C solution flow, such as an upward flow rate of 12.8 mm/sec, induction efficiency (Si—C solution stirring efficiency) will be lowered.

Figure 11:
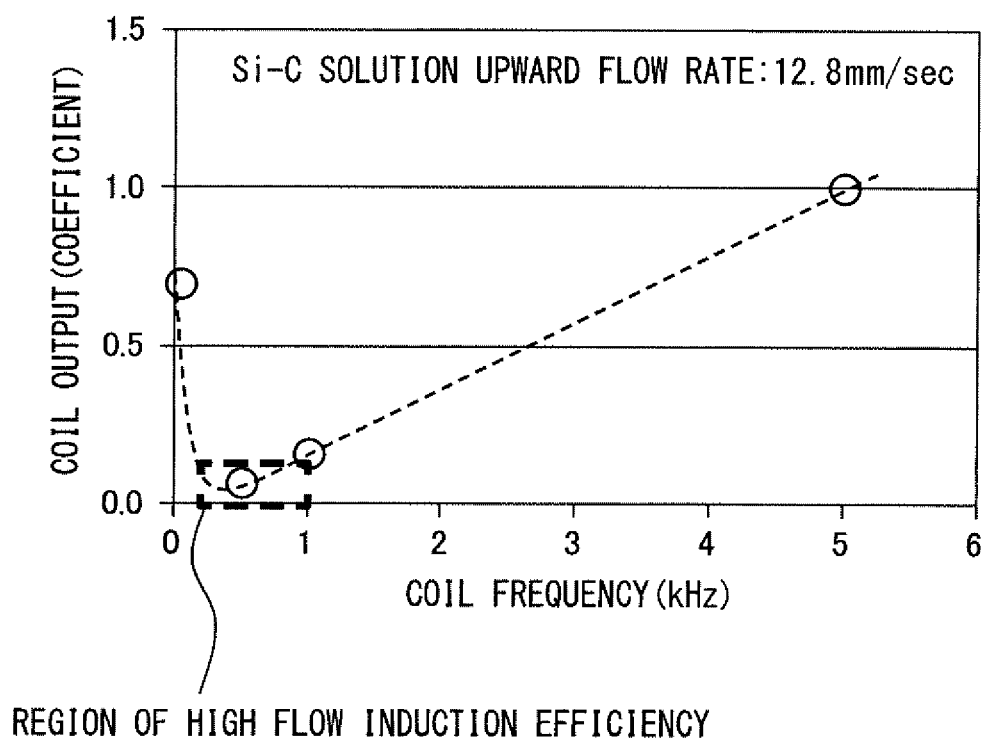
FIG. 11 is a graph showing the relationship between coil frequency and coil output (coefficient) to obtain an upward flow rate of 12.8 mm/sec for a Si—C solution.

FIG. 11 shows the relationship between coil frequency and coil output (coefficient), for obtaining an upward flow rate of 12.8 mm/sec for a Si—C solution. The coil output (coefficient) (hereunder referred to simply as "coil output") is a value expressed relative to 1 as the coil output in a combination of coil output and coil frequency (5000 Hz) that allows the conventional targets to be obtained for a Si—C solution, namely a temperature of 2000° C. and an upward flow rate of 12.8 mm/sec, when flow and heating of the Si—C solution are conducted with only a conventional induction coil. From FIG. 11 it will be understood that the coil output can be minimized, and therefore the induction efficiency increased, in the range of at least 250 Hz and not higher than 1000 Hz (the rectangular dashed region). In the prior art it has been necessary to set the coil frequency and coil current in an extremely narrow range in order to obtain the desired liquid level temperature and flow rate for a Si—C solution, but with the method of the invention in which heating of the Si—C solution is carried out with a resistance heater in a configuration such that it heats the lower part of the graphite crucible, it is possible to set the coil frequency in a frequency range that results in the greatest induction efficiency.

The frequency of the induction coil for the method of the present disclosure can therefore be set in a lower frequency range than the prior art, and preferably from 250 Hz up to 1000 Hz, more preferably from 300 Hz up to 900 Hz, and even more preferably from 350 Hz up to 800 Hz. Such a frequency range is between about 1/20 and 1/5 of the level of approximately 5000 Hz used for induction coil frequency in the prior art.

In the method of the present disclosure, heating of the Si—C solution by the induction coil is minimized while the induction coil causes the Si—C solution to have the prescribed flow, and the heating is conducted mainly by the resistance heater. Although the induction coil may heat the Si—C solution to a small extent when the induction coil induces electromagnetic stirring of the Si—C solution causing it to flow, most of the heating of the Si—C solution is conducted by the resistance heater situated so as to heat the lower part of the graphite crucible. When the frequency of the induction coil is within the aforementioned low frequency range, heating of the Si—C solution by the induction coil can be limited to a minimum. In the method of the present disclosure, when the output of the resistance heater is set to zero and an induction coil alone is used, heating of the Si—C solution 24 may be up to preferably no higher than 800° C., more preferably no higher than 600° C. and even more preferably no higher than 400° C., as the liquid level temperature of the Si—C solution. In addition to the heating of the Si—C solution that is conducted by the induction coil, the Si—C solution can be primarily heated by the resistance heater situated so as to heat the lower part of the graphite crucible, such that the liquid level temperature of the Si—C solution is preferably 1800 to 2200° C.

Heating of the lower part 5 of the graphite crucible preferably includes at least one of heating of the bottom section 3 of the graphite crucible 10 and heating of the crucible-holding shaft 7 that holds the bottom section of the graphite crucible 10, and more preferably includes both heating of the bottom section 3 of the graphite crucible 10 and heating of the crucible-holding shaft 7 that holds the bottom section of the graphite crucible 10. The graphite crucible 10 and the crucible-holding shaft 7 are preferably made of the same material. Preferably, the graphite crucible 10 and crucible-holding shaft 7 are made of graphite with a density of 1.55-2.00 g/cm$^3$.

As shown in FIGS. 9 and 10, a crucible-holding shaft 7 is situated under the bottom section 3 of the graphite crucible 10 and holds the bottom section. At least a portion of the bottom section 3 of the graphite crucible is held by the crucible-holding shaft 7. The bottom section 3 and the crucible-holding shaft 7 may be joined using a carbon adhesive or the like, or alternatively the crucible 10 and crucible-holding shaft 7 may be integrally formed by cutting out from graphite.

The shape of the graphite crucible is not particularly restricted, and any graphite crucible with a similar shape as the prior art may be used. The graphite crucible preferably has an inner diameter of 80 to 150 mm, an outer diameter of 90 to 180 mm and a depth (the length from the lowest point of the bottom inner wall of the crucible to the uppermost section of the side sections, as measured in the vertical direction) of 70 to 150 mm.

The shape of the crucible-holding shaft is not particularly restricted so long as the crucible-holding shaft can hold the crucible. The crucible-holding shaft may be cylindrical (which includes regular cylindrical and elliptic cylindrical), or rectangular columnar. From the viewpoint of stably holding the graphite crucible 10, the length of the crucible-holding shaft 7 in the vertical direction is preferably 5 mm or greater. The upper limit for the length of the crucible-holding shaft 7 in the vertical direction is not particularly restricted, and may be 100 mm or less, 50 mm or less, or 30 mm or less, for example.

The depth of the Si—C solution 24 placed in the graphite crucible 10 (the length from the lowest point of the bottom inner wall of the crucible to the liquid level, as measured in the vertical direction) is 30 mm or greater, preferably 40 mm or greater and more preferably 50 mm or greater. If the depth of the Si—C solution 24 is within the above range, it will be easier to increase the upward flow rate of the Si—C solution toward the crystal growth plane, for stable growth of a SiC single crystal. The upward flow rate of the Si—C solution is preferably 5 mm/sec or greater, more preferably 8 mm/sec or greater and even more preferably 12 mm/sec or greater. The upper limit for the upward flow rate of the Si—C solution is preferably no greater than 25 mm/sec and more preferably no greater than 20 mm/sec. An upward flow rate within the above range will allow growth of the SiC single crystal to be conducted in a stable manner.

FIG. 9 shows a preferred location for the resistance heater 30A (also referred to as a bottom section heater) that is to heat the bottom section 3 of the graphite crucible 10. The resistance heater 30A is situated approximately horizontally, in a manner facing the lower face of the bottom section of the graphite crucible 10 and allowing it to heat the bottom section 3 of the graphite crucible 10. Heating the bottom section 3 of the graphite crucible 10 with the resistance heater 30A can raise the temperature of the bottom section 3, which has tended to be at a lower temperature in prior art methods, and thus allows the ΔTd value to be reduced. The resistance heater 30A can be situated, for example, 2 to 20 mm below the lower face of the bottom section of the graphite crucible 10, as measured in the vertical direction.

The resistance heater 30A may consist of a single one, or a combination of two or more separate resistance heaters. Preferably, the two or more bottom section heaters are provided horizontally, facing the lower face of the bottom section of the graphite crucible 10. For example, the output on the horizontal inside of multiple bottom section heaters arranged in the horizontal direction, i.e. the side closer to the crucible-holding shaft, can be relatively increased while the output on the horizontal outside, i.e. the side further from the crucible-holding shaft, can be relatively decreased. The ΔTd can be further reduced by this manner of control of the output of multiple bottom section heaters situated in the horizontal direction and facing the lower face of the bottom section of the crucible.

By disposing multiple resistance heaters in this way, it is possible to partially control the temperature and thereby even further reduce the ΔTd value in a more precisely controlled manner.

Figure 12:
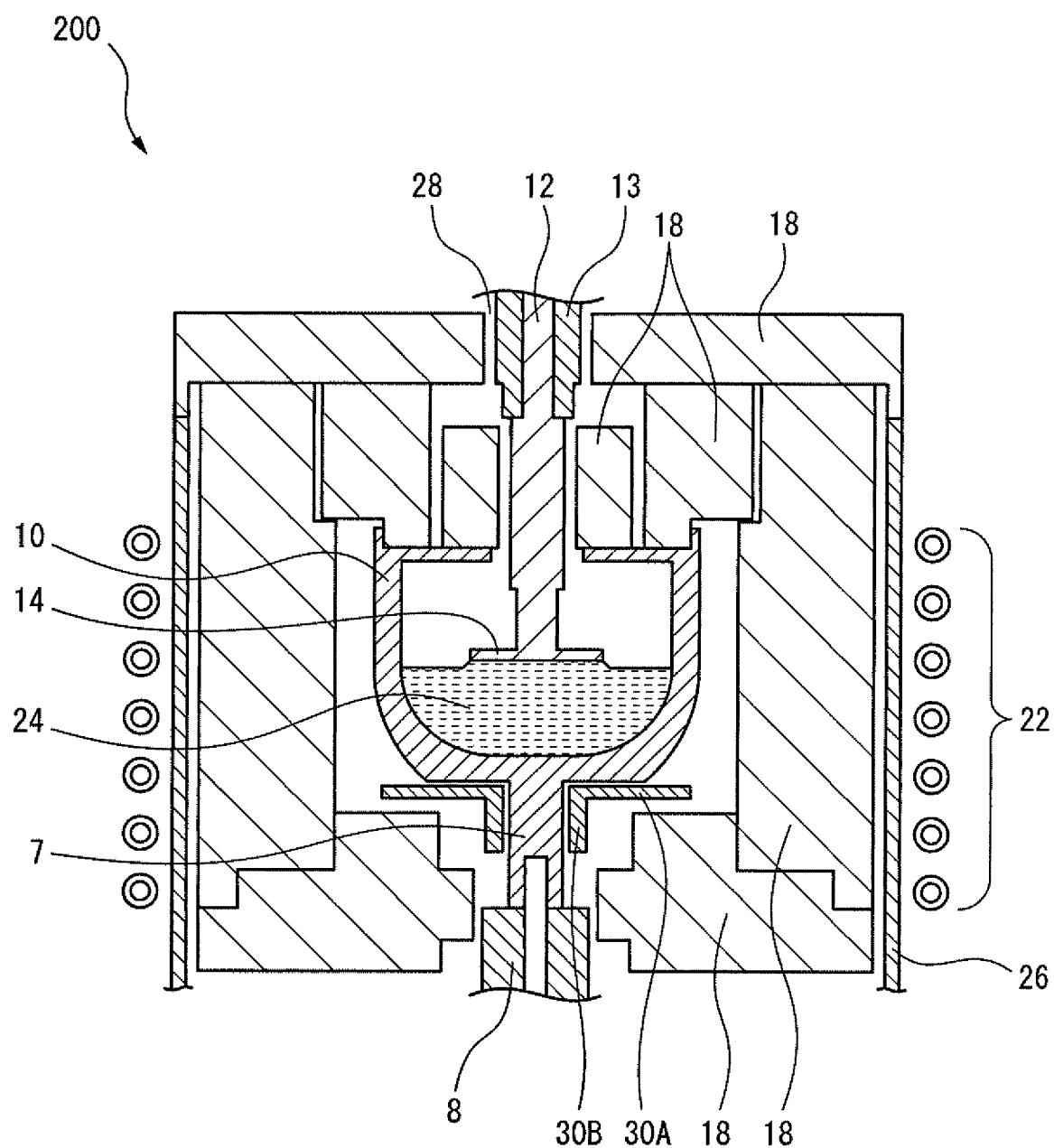
FIG. 12 is a cross-sectional schematic drawing showing a SiC single crystal production apparatus to be used in the method of the present disclosure.

FIG. 12 shows a preferred arrangement for a resistance heater 30B (also referred to as a shaft heater) that heats a crucible-holding shaft 7. The SiC single crystal production apparatus in FIG. 12 may also comprise a resistance heater 30A, or just the resistance heater 30B alone. The resistance heater 30B is situated in approximately a vertical manner around the periphery of the crucible-holding shaft 7, and heats the crucible-holding shaft 7. Heating the crucible-holding shaft 7 with the resistance heater 30B can raise the temperature of the bottom section 3, which has tended to be at a lower temperature in prior art methods, and thus allows the ΔTd value to be reduced. The resistance heater 30B may be situated at a location about 2 to 10 mm from the outer side of the crucible-holding shaft 7.

The crucible-holding shaft may also be movable in the vertical direction. When the crucible-holding shaft is movable in the vertical direction, the graphite crucible will also be movable.

Figure 13:
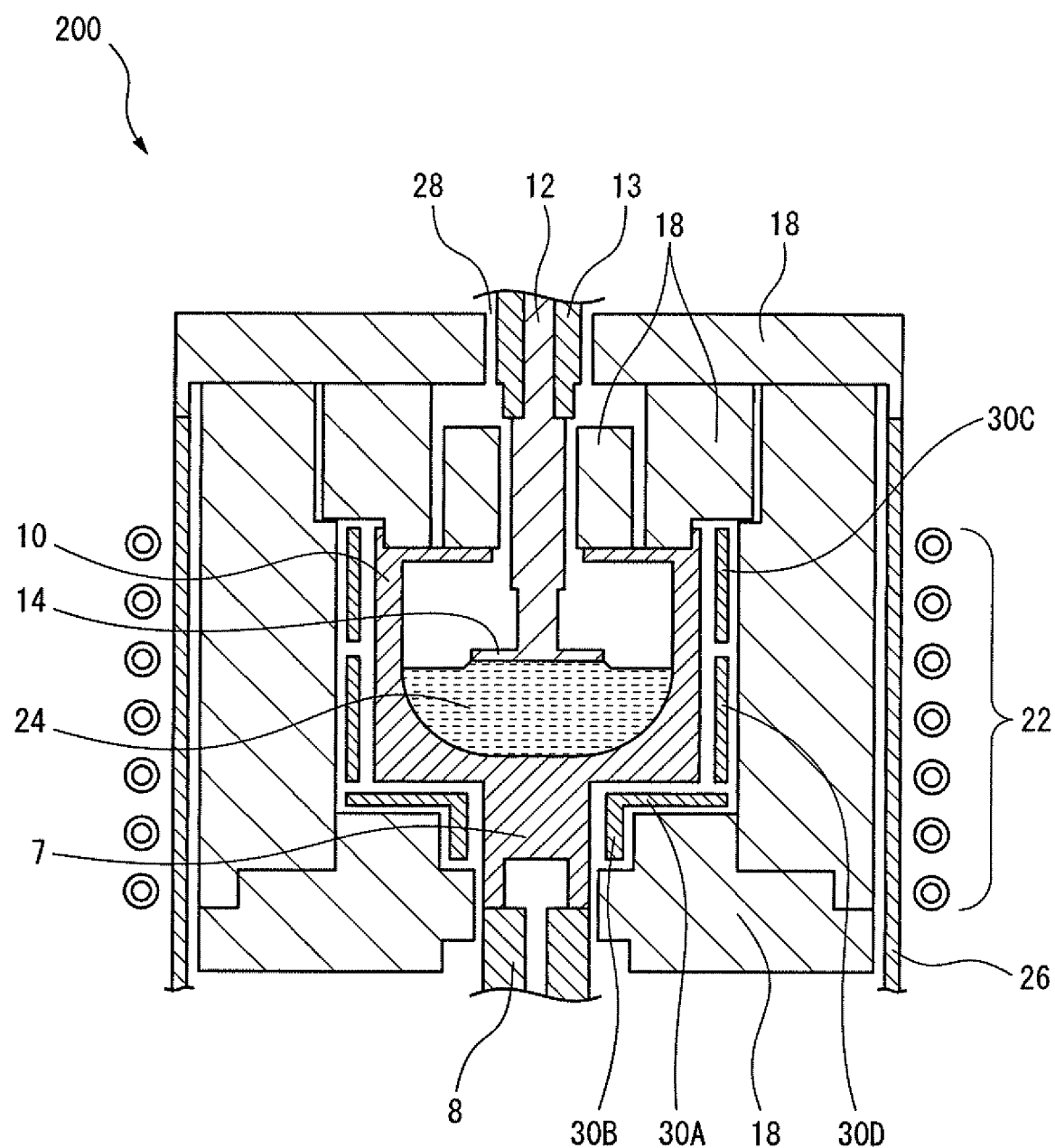
FIG. 13 is a cross-sectional schematic drawing showing a SiC single crystal production apparatus to be used in the method of the present disclosure.

The resistance heater preferably also heats the side sections of the graphite crucible. FIG. 13 shows a preferred location for resistance heaters (also referred to as side section heaters) that are to heat the side sections of the graphite crucible 10. The example shown in FIG. 13 is a SiC single crystal production apparatus 200 comprising resistance heaters 30C, 30D, as two separate side section heaters. The side section heaters are used in combination with at least one of the bottom section heater and the shaft heater. The resistance heaters 30C, 30D are situated approximately vertically, surrounding the side sections of the graphite crucible 10, in a manner allowing them to heat the side sections of the graphite crucible 10.

Preferably, the side section heaters are arranged approximately vertically from the upper part to the lower part of the crucible side sections, in a manner facing the side sections of the graphite crucible 10.

A single side section heater or two or more side section heaters may be used, and preferably two or more separate resistance heaters are used as the side section heater. When two or more resistance heaters are provided separately for heating of the side sections of the graphite crucible, preferably at least one of the separate resistance heaters is situated above the liquid level of the Si—C solution in essentially the vertical direction, while at least one other is situated below the liquid level of the Si—C solution in essentially the vertical direction, as shown in FIG. 13. In such an arrangement, it is preferred for the outputs of the bottom section heater and/or the shaft heater, and the side section heater situated above the liquid level of the Si—C solution, to be relatively higher, while the output of the side section heater situated below the liquid level of the Si—C solution is relatively lower. By setting the arrangement and outputs of the resistance heaters in this manner it is possible to further reduce the ΔTd value.

When the side section heaters are provided, an induction coil may be disposed around the periphery of the side section heaters. This will allow the side section heaters to be situated near the Si—C solution whose temperature is to be controlled, thus facilitating control of the Si—C solution temperature. However, it is preferred to form slits in the side section heaters in order to keep them from being influenced by the induced current. Slits are also preferably provided in the bottom section heater and the shaft heater. The widths and spacing of the slits may be adjusted according to the size of the graphite crucible. For example, the width of the slits may be 3-10 mm and the spacing of the slits may be 15-25 mm.

Even when the output of the resistance heater is varied, the upward flow rate of the Si—C solution will remain constant so long as the conditions of the induction coil are not varied.

The method of the present disclosure allows the value of ΔTd to be reduced to preferably no higher than 2.2° C. and more preferably no higher than 1.0° C. As shown in FIG. 6, when ΔTd is 2.2° C. or lower, a growable time period for the crystal of 50 hours or longer can be achieved.

The growable time period for the crystal is preferably 50 hours or greater and more preferably 90 hours or greater. The upper limit for the growable time for the crystal is not limited so long as holes do not form in the graphite crucible, and it may be up to 300 hours, for example.

Since the method of the present disclosure allows separate control of the temperature and the flow of a Si—C solution using an induction coil and a resistance heater, it is possible to control the induction coil and resistance heater in a manner allowing prolonged crystal growth while maintaining a ΔTd value in the desired range, from the initial stage through to the final stage of crystal growth, even considering the reduction in Si—C solution volume and reduction in wall thickness of the graphite crucible that occur as crystal growth proceeds. The bottom section heater, shaft heater and side section heaters may also be movable in the vertical direction, and their vertical positions may be varied during crystal growth.

Examples of features for the method of the present disclosure other than the one described above will now be explained. The method of the present disclosure is a method for producing a SiC single crystal by a solution process. In a solution process, a SiC seed crystal substrate can be contacted with a Si—C solution having a temperature gradient such that the temperature decreases from the interior toward the surface (liquid level) in the direction perpendicular to the liquid level, to grow a SiC single crystal. By forming such a temperature gradient in which the temperature decreases from the interior of the Si—C solution toward the liquid level of the solution, the surface region of the Si—C solution becomes supersaturated and a SiC single crystal is grown from the seed crystal substrate contacting with the Si—C solution.

FIG. 9 shows a cross-sectional schematic drawing of an example of a SiC single crystal production apparatus that can be used in the method of the present disclosure. The illustrated SiC single crystal production apparatus 200 comprises a graphite crucible 10 that receives a Si—C solution 24 having carbon dissolved in a molten liquid of Si or Si/X (X being one or more metals other than Si), a temperature gradient being formed whereby the temperature is lowered from the interior of the Si—C solution 24 toward the surface of the solution, and the seed crystal substrate 14 which is held at the tip of the seed crystal holding shaft 12 that is movable in the vertical direction, is contacted with the Si—C solution 24 to allow growth of the SiC single crystal from the seed crystal substrate 14.

The Si—C solution 24 is prepared by loading the starting materials into the graphite crucible 10, melting them by heating to prepare Si or Si/X molten liquid, and dissolving carbon therein. X in this formula is not particularly restricted so long as it is one or more metals other than Si and can form a liquid phase (solution) that is in a state of thermodynamic equilibrium with SiC (the solid phase). Examples of suitable metals for X include Ti, Cr and Ni. For example, Si may be added into the graphite crucible 10, and then Cr and other elements loaded in to form a Si/Cr solution or the like.

A Si—C solution can be formed by dissolution of carbon into the molten liquid by dissolution of the graphite crucible 10 which contains carbon, and a hydrocarbon gas may also be blown in, or a solid carbon source loaded in together with the molten liquid material, as auxiliary sources.

A heat-insulating material 18 is disposed at the periphery of the graphite crucible 10 and the resistance heater for thermal insulation. These are accommodated together inside a quartz tube 26. The induction coil 22 is situated around the outer periphery of the quartz tube 26. The heat-insulating material 18 used will generally be graphite having a density in the range of 0.1 to 0.16 g/cm$^3$.

Since the temperatures of the graphite crucible, heat-insulating material, quartz tube, resistance heater and induction coil become high, they are placed inside a water-cooling chamber. The water-cooling chamber is provided with a gas inlet and a gas exhaust vent to allow atmospheric modification in the apparatus.

The graphite crucible 10 comprises a heat-insulating material 18 at the top section, the heat-insulating material 18 being provided with an opening 28 through which the seed crystal holding shaft 12 passes. By adjusting the gap (spacing) between the heat-insulating material 18 and the seed crystal holding shaft 12 at the opening 28, it is possible to vary the amount of radiative heat loss from the surface of the Si—C solution 24. It is usually necessary to keep the interior of the graphite crucible 10 at high temperature, but setting a large gap between the heat-insulating material 18 and the seed crystal holding shaft 12 at the opening 28 can increase radiative heat loss from the surface of the Si—C solution 24, whereas setting a small gap between the heat-insulating material 18 and the seed crystal holding shaft 12 at the opening 28 can reduce radiative heat loss from the surface of the Si—C solution 24. The gap (spacing) between the heat-insulating material 18 and the seed crystal holding shaft 12 at the opening 28 is preferably 1 to 5 mm and more preferably 3 to 4 mm. When a meniscus has formed, as described below, radiative heat loss can take place from the meniscus portion as well.

The temperature of the Si—C solution 24 will usually have a temperature distribution with a lower temperature at the surface than the interior of the Si—C solution 24 due to radiation and the like. In addition, by adjusting the output of the induction coil, and more significantly of the resistance heater, it is possible to form a temperature gradient in the Si—C solution 24 in the direction perpendicular to the surface of the Si—C solution 24 so that the top of the solution contacting the seed crystal substrate 14 is at low temperature and the lower part (the interior) of the solution is at high temperature. The temperature gradient is preferably 10 to 50° C./cm in a region from, for example, the liquid level of the Si—C solution to a depth of about 1 cm.

The carbon that has dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from the induction coil, but primarily from the resistance heater, and also due to heat loss from the surface of the Si—C solution 24 and heat loss through the seed crystal holding shaft 12. When the carbon that has dissolved into the solution interior that is at high temperature and has high solubility reaches the region near the seed crystal substrate that is at low temperature and has low solubility, a supersaturated state appears and a SiC crystal is grown on the seed crystal substrate 14 by virtue of supersaturation as a driving force.

Figure 14:
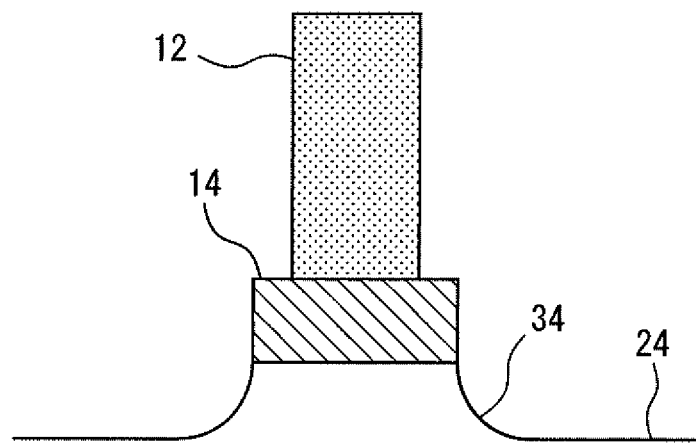
FIG. 14 is a cross-sectional schematic drawing of the meniscus formed between a seed crystal substrate and a Si—C solution.

During growth of a SiC single crystal, it is also preferred to conduct the crystal growth while forming a meniscus between the seed crystal substrate and the Si—C solution. The term "meniscus" refers to a concave curved surface 34 formed on the surface of the Si—C solution 24 raised by surface tension upon wetting of the seed crystal substrate 14, as shown in FIG. 14. It is possible to grow a SiC single crystal while forming a meniscus between the seed crystal substrate 14 and the Si—C solution 24. To form a meniscus, for example, after the seed crystal substrate 14 has been contacted with the Si—C solution 24, the seed crystal substrate 14 may be raised and held at a position where the bottom face of the seed crystal substrate 14 is higher than the liquid level of the Si—C solution 24.

Also, since the meniscus portion formed on the outer peripheral section of the growth interface is at a lower temperature due to radiative heat loss, formation of the meniscus facilitates increase in the temperature gradient. Furthermore, since a temperature gradient can be formed in which the temperature of the Si—C solution at the outer peripheral section is lower than at the center section directly below the crystal growth plane interface, the degree of supersaturation of the Si—C solution at the outer peripheral section of the growth interface can be greater than the degree of supersaturation of the Si—C solution at the center section of the growth interface.

By thus forming a gradient for the degree of supersaturation in the horizontal direction within the Si—C solution directly below the crystal growth interface, a SiC crystal can be grown having a concave crystal growth surface. This allows crystal growth to be accomplished without the crystal growth plane of the SiC single crystal being on the exact plane, and can help to more easily minimize generation of inclusions and threading dislocations.

In the method of the present disclosure, it is possible to use as the seed crystal substrate a SiC single crystal of the same quality commonly used for production of SiC single crystals, and for example, a SiC single crystal formed in the common manner by a sublimation process may be the seed crystal substrate.

For example, it is possible to use as the seed crystal substrate a SiC single crystal having a flat growth surface and a (0001) exact plane or (000-1) exact plane, or a SiC single crystal having an offset angle of greater than 0° and no greater than 8° from the (0001) exact plane or (000-1) exact plane, or a SiC single crystal having a concave growth surface and a (0001) face or (000-1) face at a section near the center section of the concave growth surface.

The overall shape of the seed crystal substrate may be any desired shape, such as plate-like, discoid, cylindrical, columnar, truncated conic or truncated pyramidal.

Placement of the seed crystal substrate in the single crystal production apparatus may be carried out by holding the top face of the seed crystal substrate on the seed crystal holding shaft using an adhesive or the like. The adhesive may be a carbon adhesive.

Contact of the seed crystal substrate with the Si—C solution may be conducted by lowering the seed crystal holding shaft holding the seed crystal substrate toward the Si—C liquid level, and contacting the seed crystal substrate with the Si—C solution while the bottom face of the seed crystal substrate is parallel to the Si—C solution surface. Then, the seed crystal substrate may be held at a prescribed position relative to the Si—C solution surface for growth of the SiC single crystal.

The holding position of the seed crystal substrate may be such that the position of the bottom face of the seed crystal substrate matches the Si—C solution surface, or is below the Si—C solution surface, or is above the Si—C solution surface. When it is held such that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. The position of the bottom face of the seed crystal substrate may match the Si—C solution surface or it may be lower than the Si—C solution surface, but in order to form a meniscus as mentioned above, it is preferred to conduct crystal growth by holding the bottom face of the seed crystal substrate at a position above the Si—C solution surface. Also, in order to prevent generation of polycrystals, preferably the Si—C solution is not contacted with the seed crystal holding shaft. By forming a meniscus, it is possible to easily prevent contact of the Si—C solution with the seed crystal holding shaft. In such methods, the position of the seed crystal substrate may be adjusted during crystal growth.

The seed crystal holding shaft may be a graphite shaft holding the seed crystal substrate at one end face. Preferably, the seed crystal holding shaft is made of the same material as the crucible. The seed crystal holding shaft may have any desired shape, such as cylindrical or columnar, and there may be used a graphite shaft having the same end face shape as the top face of the seed crystal substrate.

Temperature measurement of the Si—C solution can be carried out using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Meltback may be carried out in which the surface layer of the seed crystal substrate is dissolved in the Si—C solution and removed before SiC single crystal growth. Since the surface layer of the seed crystal substrate on which the SiC single crystal is to be grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on the processed conditions of the surface of the seed crystal substrate, it is preferably about 5 to 100 μm for sufficient removal of an affected layer and a natural oxide film.

The meltback may be carried out by forming in the Si—C solution a temperature gradient such that the temperature increases from the interior of the Si—C solution toward the surface of the solution, i.e., by forming a temperature gradient in a direction opposite to the case of the SiC single crystal growth. The temperature gradient in the opposite direction can be formed by controlling the output of the induction coil.

The seed crystal substrate may be preheated in advance, and then the same is contacted with the Si—C solution. If the seed crystal substrate at low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In this case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocation and growing a high-quality SiC single crystal.

The present disclosure further provides an apparatus for production of a SiC single crystal comprising: a graphite crucible that houses a Si—C solution, an induction coil, a resistance heater, and a seed crystal holding shaft disposed in a movable manner in the vertical direction, the apparatus being employed in a solution process in which a seed crystal substrate held on the seed crystal holding shaft is contacted with the Si—C solution that has been heated so as to have a temperature gradient in which a temperature of the Si—C solution decreases from an interior of the Si—C solution toward a liquid level of the Si—C solution, to grow a SiC single crystal from the seed crystal substrate, wherein the graphite crucible is held on the crucible-holding shaft by a bottom section of the graphite crucible, the induction coil is situated surrounding side sections of the graphite crucible, and the resistance heater is disposed at a location such that the resistance heater heats a lower part of the graphite crucible.

In the apparatus of the present disclosure, the desired flow of the Si—C solution is obtained while the ΔTd value is lowered allowing the graphite crucible to dissolve in a more uniform manner than in the prior art, so that growth of a long crystal can be achieved by prolonged crystal growth.

The above description in regard to the production method applies equally to the feature of this apparatus.

EXAMPLES

The ΔTd value during growth of a SiC single crystal by a solution process (Flux process) was simulated using CGSim (simulation software for bulk crystal growth from solution by STR Japan, Ver. 14.1).

The value of ΔTd was calculated as the difference between the maximum temperature and the minimum temperature in the regions of the Si—C solution that are in contact with the inner wall of the graphite crucible shown in FIG. 5.

Comparative Example 1: Apparatus Construction with Conventional Induction Coil Alone The simulation conditions were set to the following analytical model and conditions.

(Analytical Model and Conditions)

Figure 15:
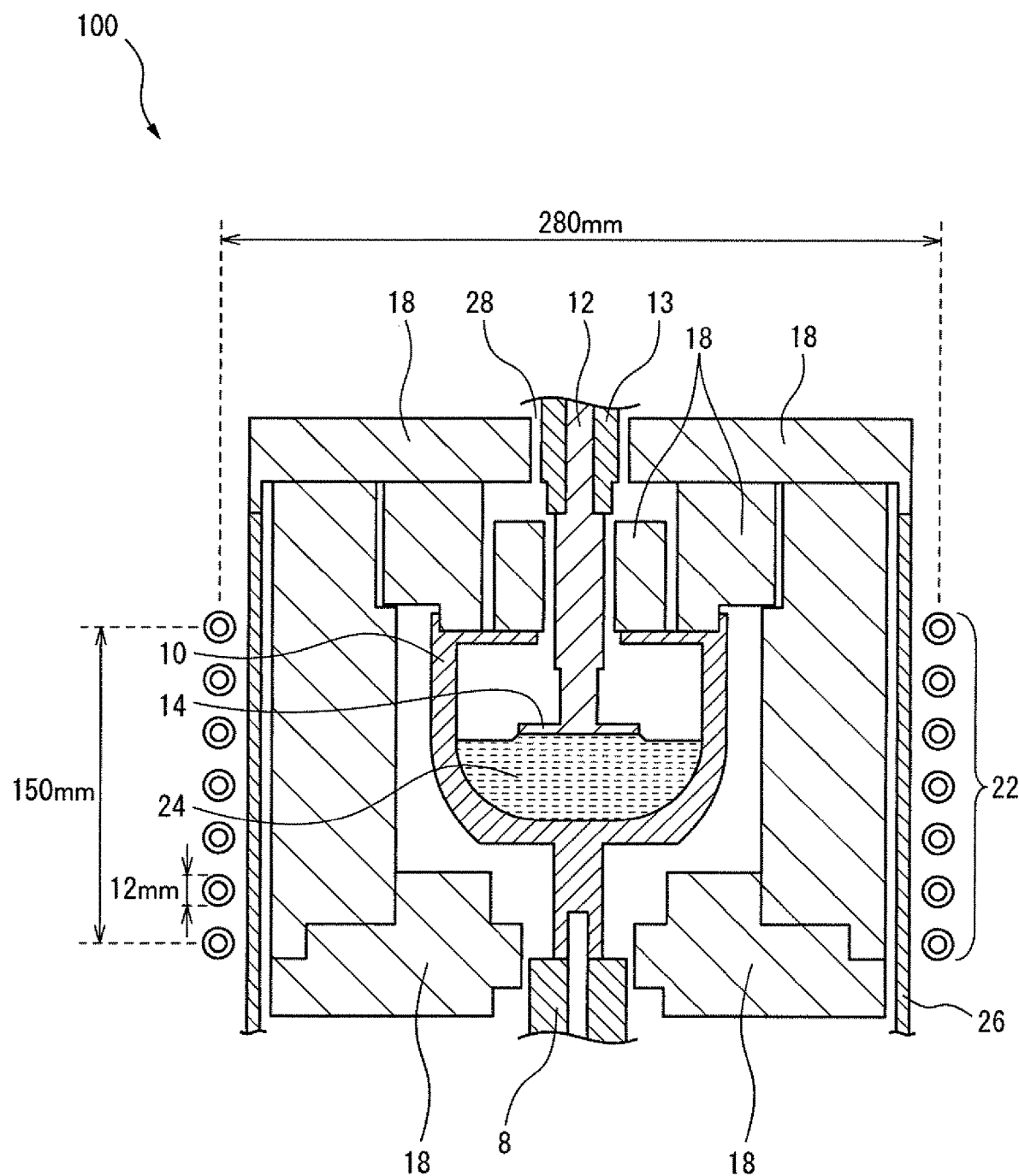
FIG. 15 is a cross-sectional schematic drawing of a SiC single crystal production apparatus of the type used in the prior art.

As a single crystal production apparatus there was prepared a symmetrical model of the construction of a conventional single crystal production apparatus 100 as shown in FIG. 15. The seed crystal holding shaft 12 was a graphite shaft with a circular columnar shape having a diameter of 11 mm/20 mm/15 mm in the regions of 50 mm/67 mm/24 mm from the top section toward the bottom section, and a length of 141 mm, and comprising a disc with a thickness of 4 mm and a diameter of 50 mm at the tip. The top section of the seed crystal holding shaft 12 was held on a stainless steel holder 13 having a maximum diameter of 27 mm. The seed crystal substrate 14 was a discoid SiC single crystal having a thickness of 0.7 mm and a diameter of 50 mm, and with the (000-1) face as the growth surface.

The top face of the seed crystal substrate 14 was held at the end face of the seed crystal holding shaft 12. The seed crystal holding shaft 12 was inserted through an opening 28 with a diameter of 40 mm at the top section of a graphite heat-insulating material 18 with a thickness of 27.5 mm, for positioning of the seed crystal holding shaft 12 and seed crystal substrate 14. The gaps between the heat-insulating material 18 and the stainless steel holder 13 holding the seed crystal holding shaft 12 at the opening 28 were each 4 mm.

A Si/Cr molten liquid with a composition of Si:Cr=60:40 (at %) was loaded into a graphite crucible 10 having an outer diameter of 120 mm, an inner diameter of 100 mm, a wall thickness of 10 mm and a depth (length from the lowest point of the bottom inner wall of the crucible to the uppermost section of the side section of the crucible, as measured in the vertical direction) of 77.5 mm, in a depth range of 35 mm from the inner wall of the crucible. The bottom section of the graphite crucible 10 was held by a crucible-holding shaft 7 having the same material as the crucible, a diameter of 20 mm and a length of 50 mm. The bottom section of the crucible-holding shaft 7 was held by a high-strength, high-elasticity graphite holder 8. The atmosphere inside the single crystal production apparatus 200 was helium. An induction coil 22 with a diameter of 280 mm, a height of 150 mm and an outer coil diameter of 12 mm was placed in a manner surrounding the side section of the graphite crucible 10, symmetrically in the vertical direction. The induction coil 22 comprised a 7-wind high-frequency coil. The high-frequency power supply frequency of the induction coil 22 was 5000 Hz, and the coil current was $2.13 \times 10^6$ A.

The seed crystal substrate 14 held on the seed crystal holding shaft was positioned so that the bottom face of the seed crystal substrate 14 was located 2 mm above the location of the liquid level of the Si—C solution 24, and a meniscus was formed as shown in FIG. 14, so that the Si—C solution wetted the entire bottom face of the seed crystal substrate 14. The diameter of the meniscus portion at the liquid level of the Si—C solution 24 was 54 mm, with the shape of the meniscus between the liquid level of the Si—C solution 24 and the bottom face of the seed crystal substrate 14 being considered rectilinear for simplification of the calculation. The temperature at the center of the liquid level of the Si—C solution 24 was 2000° C., and the temperature difference between the temperature at the surface of the Si—C solution and the temperature at a depth of 1 cm in the vertical direction from the surface of the Si—C solution 24 toward the interior of the solution was 0.1° C., with the surface of the Si—C solution as the low-temperature side. The crucible 10 was rotated at 3 rpm, with the central axis of the seed crystal holding shaft 12 as the center.

The other simulation conditions were as follows:
calculation using 2D symmetrical model;
the physical properties of the materials were as follows:
graphite crucible 10, seed crystal holding shaft 12: graphite, density=1.8 g/cm³, thermal conductivity at 2000° C.=17 W/(m·K), emission ratio=0.765;
heat-insulating material 18: graphite, density=0.13 g/cm³, thermal conductivity at 2500° C.=4.5 W/(m·K), emission ratio=0.8;
Si—C solution: molten Si/Cr, thermal conductivity at 2000° C.=66.5 W/(m·K), emission ratio=0.9; density=2600 kg/m³, electric conductivity=2,245,000 S/m;
He: thermal conductivity at 2000° C.=0.579 W/(m·K);
temperature of water-cooling chamber and induction coil=300K;
crucible-holding shaft holder section 8: high-strength, high elasticity graphite, density=1.60 g/cm³, thermal conductivity=27 W/m·K, emission ratio=0.765.
seed crystal holding shaft holder section 13: stainless steel, density=7.93 g/cm³, thermal conductivity=25.7 W/m·K, emission ratio=0.45.

A simulation was carried out under the above conditions, resulting in a calculated ΔTd value of 4.7° C.

Example 1: Apparatus Construction with Induction Coil+Bottom Section Heater

As a single crystal production apparatus there was prepared a symmetrical model of the construction of a single crystal production apparatus 200 as shown in FIG. 9. The ΔTd value was calculated under the same conditions as Comparative Example 1, except that the high-frequency power supply frequency of the induction coil 22 was 5000 Hz, the coil current was $1.98 \times 10^6$ A, and as shown in FIG. 9, a hollow discoid resistance heater 30A with an inner diameter of 24 mm, an outer diameter of 114 mm and a height of 5 mm was horizontally situated, as the bottom section heater, 2 mm below the lower face of the bottom section of the graphite crucible 10 as measured in the vertical direction, and heating of the bottom section of the graphite crucible was carried out with a power density of 23 W/cm³. The ΔTd value was 2.2° C.

Example 2: Apparatus Construction with Induction Coil+Bottom Section Heater and Shaft Heater The ΔTd value was calculated under the same conditions as Example 1, except that as shown in FIG. 12, a hollow cylindrical resistance heater 30B with an inner diameter of 24 mm, an outer diameter of 38 mm and a height of 20 mm was vertically situated, as the shaft heater, around the periphery of the crucible-holding shaft 7, and heating of the lower part of the graphite crucible was carried out with a power density of 15 W/cm$^3$ for the resistance heater 30A and a power density of 25 W/cm$^3$ for the resistance heater 30B. The ΔTd value was 1.1° C. The resistance heater 30A and resistance heater 30B had independently controllable outputs. This also applies to the resistance heaters described below.

Example 3: Apparatus Construction if Induction Coil+Bottom Section Heater, Shaft Heater and Side Section Heater The ΔTd value was calculated under the same conditions as Comparative Example 1, except for the following.

The high-frequency power supply frequency of the induction coil 22 was 500 Hz, and the coil current was 1.41×10$^5$ A. A graphite crucible having the same shape as in Comparative Example 1 was used, except that the outer diameter shape of the bottom section of the graphite crucible 10 was rectangular, and the bottom section was held by a crucible-holding shaft with a diameter of 40 mm and a length of 50 mm, as shown in FIG. 13. As shown in FIG. 13, the bottom section heater, shaft heater and side section heaters used were, respectively, a hollow discoid resistance heater 30A with an inner diameter of 50 mm, an outer diameter of 140 mm and a height of 5 mm, a hollow cylindrical resistance heater 30B with an inner diameter of 50 mm, an outer diameter of 64 mm and a height of 20 mm, a hollow cylindrical resistance heater 30C with an inner diameter of 130 mm, an outer diameter of 140 mm and a height of 45 mm, and a hollow cylindrical resistance heater 30D with an inner diameter of 130 mm, an outer diameter of 140 mm and a height of 50 mm. The resistance heater 30A was horizontally situated, 5 mm below the lower face of the bottom section of the graphite crucible 10 as measured in the vertical direction. The spacing between the adjacent heaters was 5 mm. The power densities of the resistance heaters 30A to 30D were 10 W/cm$^3$, 10 W/cm$^3$, 18 W/cm$^3$ and 5 W/cm$^3$, respectively.

The ΔTd value was 1.5° C.

Example 4: Output Variation

The ΔTd value was calculated under the same conditions as Example 3, except that the power densities of the resistance heaters 30A to 30D were 10 W/cm$^3$, 10 W/cm$^3$, 17 W/cm$^3$ and 4 W/cm$^3$, respectively. The ΔTd value was 1.0° C.

Example 5: Output Variation

The ΔTd value was calculated under the same conditions as Example 3, except that the power densities of the resistance heaters 30A to 30D were 10 W/cm$^3$, 10 W/cm$^3$, 16 W/cm$^3$ and 3.8 W/cm$^3$, respectively. The ΔTd value was 0.9° C.

Example 6: Output Variation

The ΔTd value was calculated under the same conditions as Example 3, except that the power densities of the resistance heaters 30A to 30D were 10 W/cm$^3$, 11 W/cm$^3$, 17 W/cm$^3$ and 4 W/cm$^3$, respectively. The ΔTd value was 0.8° C.

Example 7: Apparatus Construction with Induction Coil+Two Bottom Section Heaters, Shaft Heater and Side Section Heater The ΔTd value was calculated under the same conditions as Example 3, except that, instead of the resistance heater 30A used in Example 3 there were used a hollow discoid resistance heater 30A1 with an inner diameter of 50 mm, an outer diameter of 100 mm and a height of 5 mm and a hollow discoid resistance heater 30A2 with an inner diameter of 110 mm, an outer diameter of 140 mm and a height of 5 mm, as shown in FIG. 15, and the power densities of the resistance heater 30A1, resistance heater 30A2, resistance heater 30B, resistance heater 30C and resistance heater 30D were 11 W/cm$^3$, 10 W/cm$^3$, 12 W/cm$^3$, 17 W/cm$^3$ and 5 W/cm$^3$, respectively. The ΔTd value was 0.7° C.

TABLE 1

Figure 16:
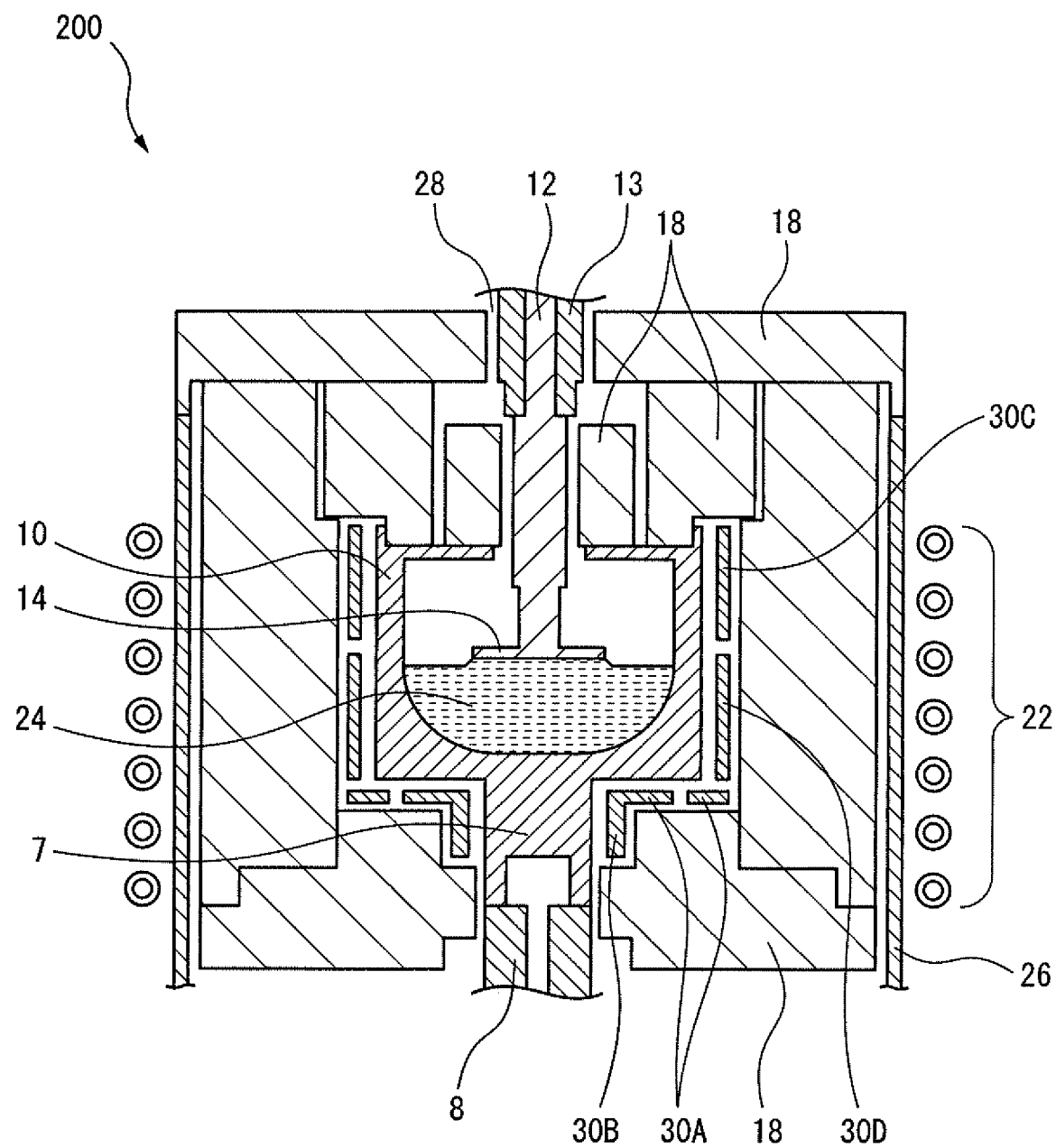
FIG. 16 is a cross-sectional schematic drawing showing a SiC single crystal production apparatus to be used in the method of the present disclosure.

|  | Comp. Ex. 1 | Example 1 | Example 2 | Example 3 | Example 4 | Example 5 | Example 6 | Example 7 |
|---|---|---|---|---|---|---|---|---|
| Relevant drawing | FIG. 15 | FIG. 9 | FIG. 12 | FIG. 13 | FIG. 13 | FIG. 13 | FIG. 13 | FIG. 16 |
| Induction coil frequency (Hz) | 5000 | 5000 | 5000 | 500 | 500 | 500 | 500 | 500 |
| Induction coil current (A) | 2.13 × 10$^6$ | 1.98 × 10$^6$ | 1.98 × 10$^6$ | 1.41 × 10$^5$ | 1.41 × 10$^5$ | 1.41 × 10$^5$ | 1.41 × 10$^5$ | 1.41 × 10$^5$ |
| Output density of bottom section heater 30A (W/cm$^3$) | None | 23 | 15 | 10 | 10 | 10 | 10 | 11 |
| Output density of shaft heater 30B (W/cm$^3$) | None | None | 25 | 10 | 10 | 10 | 11 | 10 |
| Output density of side section heater 30C (W/cm$^3$) | None | None | None | 18 | 17 | 16 | 17 | 17 |
| Output density of side section heater 30D (W/cm$^3$) | None | None | None | 5 | 4 | 3.8 | 4 | 5 |
| Upward flow rate of Si—C solution (mm/sec) | 9.4 | 8.6 | 8.6 | 16.7 | 16.7 | 16.7 | 16.7 | 16.7 |
| Surface temperature of Si—C solution (° C.) | 2000 | 2000 | 2000 | 2000 | 2000 | 2000 | 2000 | 2000 |
| ΔTd (° C.) | 4.7 | 2.2 | 1.1 | 1.5 | 1.0 | 0.9 | 0.8 | 0.7 |

The number and arrangement of the induction coil and resistance heaters are not limited to the examples described above, and they may be modified according to the size of the crystal to be grown and the dimensions of the crucible.

EXPLANATION OF SYMBOLS

1 Graphite crucible side section
3 Graphite crucible bottom section
5 Graphite crucible lower part
7 Crucible-holding shaft
8 Crucible-holding shaft holder section
10 Graphite crucible
100 Single crystal production apparatus
200 Single crystal production apparatus
12 Seed crystal holding shaft
13 Seed crystal holding shaft holder section
14 Seed crystal substrate
18 Heat-insulating material
22 Induction coil 24 Si—C solution
26 Quartz tube
28 Opening at top of crucible
30A, 30A1, 30A2 Bottom section heaters
30B Shaft heater
30C Side section heater
30D Side section heater
34 Meniscus

What is claimed is:

1. A method for producing a SiC single crystal in which a seed crystal substrate held on a seed crystal holding shaft is contacted with a Si—C solution having a temperature gradient such that a temperature of the Si—C solution decreases from an interior of the Si—C solution toward a liquid level of the Si—C solution, in a graphite crucible, to grow a SiC single crystal, wherein the method comprises the steps of:
   electromagnetic stirring of the Si—C solution with an induction coil to produce a flow, and
   heating of a lower part of the graphite crucible with a resistance heater,
   wherein the resistance heater is situated, at least in part, approximately horizontally, in a manner facing the lower face of the bottom section of the graphite crucible.

2. The method for producing a SiC single crystal according to claim 1, wherein the heating of the lower part of the graphite crucible comprises at least one of heating of a bottom section of the graphite crucible and heating of a crucible-holding shaft that holds the bottom section of the graphite crucible.

3. The method for producing a SiC single crystal according to claim 1, wherein the method further comprises heating of side sections of the graphite crucible with the resistance heater.

4. The method for producing a SiC single crystal according to claim 2, wherein the method further comprises heating of side sections of the graphite crucible with the resistance heater.

5. An apparatus for production of a SiC single crystal comprising:
   a graphite crucible that houses a Si—C solution,
   an induction coil,
   a resistance heater, and
   a seed crystal holding shaft disposed in a movable manner in the vertical direction,
   the apparatus being employed in a solution process in which a seed crystal substrate held on the seed crystal holding shaft is contacted with the Si—C solution that has been heated so as to have a temperature gradient in which a temperature of the Si—C solution decreases from an interior of the Si—C solution toward a liquid level of the Si—C solution, to grow a SiC single crystal from the seed crystal substrate,
   wherein the graphite crucible is held on the crucible-holding shaft by a bottom section of the graphite crucible,
   the induction coil is situated surrounding side sections of the graphite crucible,
   the resistance heater is disposed at a location such that the resistance heater heats a lower part of the graphite crucible, and
   the resistance heater is situated, at least in part, approximately horizontally, in a manner facing the lower face of the bottom section of the graphite crucible.

6. The apparatus for production of a SiC single crystal according to claim 5, wherein the resistance heater is disposed in at least one of a location facing a lower face of the bottom section of the graphite crucible and a location surrounding the crucible-holding shaft.

7. The apparatus for production of a SiC single crystal according to claim 5, wherein the resistance heater is further disposed surrounding the side sections of the graphite crucible and inside the induction coil.

8. The apparatus for production of a SiC single crystal according to claim 6, wherein the resistance heater is further disposed surrounding the side sections of the graphite crucible and inside the induction coil.

* * * * *